United States Patent [19]
Mishina et al.

[11] Patent Number: 5,716,207
[45] Date of Patent: Feb. 10, 1998

[54] HEATING FURNACE

[75] Inventors: Haruo Mishina, Ushiku; Kiyoshi Imaisumi; Shinya Yamama, both of Ryugasaki, all of Japan

[73] Assignee: Hitachi Techno Engineering Co., Ltd., Tokyo, Japan

[21] Appl. No.: 686,692

[22] Filed: Jul. 26, 1996

[30] Foreign Application Priority Data

Jul. 26, 1995 [JP] Japan ................. 7-190497
Mar. 13, 1996 [JP] Japan ................. 8-056192

[51] Int. Cl.$^6$ .................................................. F27D 5/00
[52] U.S. Cl. .................... 432/253; 432/5; 432/6; 432/11; 432/241
[58] Field of Search ....................... 432/241, 5, 6, 432/11, 253, 152

[56] References Cited

U.S. PATENT DOCUMENTS

| | | | |
|---|---|---|---|
| 4,591,044 | 5/1986 | Ogami et al. | 198/346.3 |
| 4,775,317 | 10/1988 | Schulke et al. | 432/241 |
| 5,055,036 | 10/1991 | Asano et al. | 432/5 |
| 5,090,900 | 2/1992 | Rudolf et al. | 432/239 |
| 5,207,578 | 5/1993 | Sakata | 432/253 |
| 5,273,423 | 12/1993 | Shiraiwa | 432/253 |
| 5,480,300 | 1/1996 | Okoshi et al. | 432/241 |
| 5,482,558 | 1/1996 | Watanabe et al. | 432/241 |

*Primary Examiner*—Henry A. Bennett
*Assistant Examiner*—Jiping Lu
*Attorney, Agent, or Firm*—Evenson, McKeown, Edwards & Lenahan, P.L.L.C.

[57] ABSTRACT

A heating furnace and a method for uniformly thermosetting a paste applied onto the surface of a substrate, and for manufacturing a high quality substrate. The heating furnace can be installed in a small area. A plurality of up-and-down moving pins are provided in a furnace body. The plurality of up-and-down moving pins are penetrating a hot plate having a heater and are vertically movable. A substrate loaded through an opening port in an isolation wall is mounted onto the up-and-down moving pins moved in their upper position. The substrate moved down near the hot plate using the up-and-down moving pins is preheated by the heated hot plate. Then, the substrate is further moved down and vacuum attracted to the hot plate to be heated by the hot plate. After that, the substrate is moved up to the original position and nitrogen gas from nozzles of a gas supply pipe is blown on the surface of the substrate to accelerate cooling of the substrate. After being cooled, the substrate is unloaded through the opening port.

20 Claims, 7 Drawing Sheets ns of FIG. 12.
HEATING FURNACE

BACKGROUND AND SUMMARY OF THE INVENTION

The present invention relates to a heating furnace and a method for heating mainly a panel or a board in a fabricating process of a liquid display panel, a plasma display panel or a printed circuit board.

In the recent years, liquid crystal display panels (hereinafter, referred to as "liquid crystal panel") and plasma display panels have been widely used for display devices since they have characteristics of light weight, thin thickness and low electric power consumption. In taking the liquid crystal panel as an example, there is a process in a liquid crystal panel manufacturing process in which sealant applied onto a liquid crystal panel glass substrate and is heated to set the sealant. The heating means used in the past is a hot plate type heating furnace on which a glass substrate is mounted to heat the sealant at a desired temperature.

Japanese Patent Application Laid-Open No. 2-83230 (1990) shows a conventional heating furnace. FIG. 12 is a schematic vertical cross-sectional view showing an example of a conventional heating furnace and FIG. 13 is a cross-sectional view being taken on the plane of the line XIII—XIII of FIG. 12. Referring to FIG. 12 and FIG. 13, the conventional heating furnace involves a loading portion 40, a main body 41, an unloading portion 42, a substrate transfer mechanism 43, a furnace body case 44, a motor 45, a ball screw 46, a nut 47, a linear guide 48, a lateral direction transfer mechanism 49, a motor 50, a ball screw 51, a nut 52, a linear guide 53, a cam 54, a guide 55, a longitudinal direction transfer mechanism 56, a substrate transfer mechanism 57, a rack frame 58, a substrate 59, hot plates 60a to 60c (hereinafter, when a hot plate is specified, the specified hot plate is identified by adding a small alphabetical letter after the reference character such as "hot plate 60a, 60b or 60c". When the whole hot plates are indicated, a general term such as "hot plates 60" is used.), a pillar 61 and an exhausting pipe 62.

In FIG. 12, a substrate 59 applied with sealant in the preceding process is held at the loading portion 40 before being loaded into the heating furnace. Inside the main body of heating furnace, the hot plates 60a to 60c are provided for mounting the substrate 59 to be heated. The substrate 59 after completing the sealant thermo-setting treatment, is transferred to the unloading portion 42 of the heating furnace, and is unloaded to the next process.

Inside the main body 41 of the heating furnace, the substrate transfer mechanism 43 for transmitting the substrate 59 from the loading portion 40 toward the unloading portion is provided under the hot plates 60, and the hot plates 60 and the substrate transfer mechanism 43 are covered with the furnace body case 44. In the ceiling portion of the furnace body case 44, there is provided the exhausting pipe 62 for exhausting a gas produced inside the furnace body case.

The hot plates 60 are supported by the pillars 61, and the furnace body case 44 and the pillars 61 are fixed to the rack frame 58 in the bottom portion of the apparatus. The substrate transfer mechanism 43 comprises the lateral direction transfer mechanism 49 composed of the motor 45, the ball screw 46, the nut 47, the linear guide 48 and so on, the longitudinal direction transfer mechanism 56 composed of the motor 50, the ball screw 51, the nut 52, the linear guide 53, the cam 54, the guide 55 and so on, and the substrate transfer plate 57 extending from the loading portion 40 to the unloading portion 42 through the furnace body case 44.

The lateral direction transfer mechanism 49 for driving the substrate transfer plate 57 converts rotation of the motor 45 into linear transference by the ball screw 46 and the nut 47 to drive the substrate transfer plate 57 on the linear guide 48 in the left and right directions of FIG. 12. The distance to which the lateral direction transfer mechanism 49 transfers the substrate transfer plate 57 is equal to the distance between the centers of each of the hot plates 60a to 60c. The longitudinal direction transfer mechanism 56 converts rotation of the motor 50 into linear transference by the ball screw 51 and the nut 52 to vertically drive the guide 55 on the cam 54 by driving the cam 54 on the linear guide 53. Thereby, the substrate transfer plate 57 is driven in the up and down directions of FIG. 12.

Each of the motors 45, 50 incorporates an encoder and is connected to a controller which is not shown. Each of the motors 45, 50 transmits a signal to the controller when each of the motors rotates in a certain direction by a certain amount of rotation, and the controller controls stopping, rotation in the normal direction and rotation in the reverse direction of each of the motors 45, 50 depending on the signal.

The sealant applied onto the substrate 59 has a specific critical temperature at which setting rapidly progresses to change properties of the sealant. When the temperature of the sealant exceeds the specific critical temperature, the sealant rapidly sets. Therefore, if the temperature of the substrate 59 exceeds the critical temperature not in a uniform distribution over the whole surface of the substrate 59, unevenness occurs in setting of the sealant and consequently non-uniformity occurs in the properties of the sealant such as hardness, adhesive property and so on to degrade the quality of the substrate 59.

Further, if the substrate 59 is rapidly heated, the temperature difference on the surface of the substrate 59 becomes large in the period from rising of the substrate 59 temperature to being stabilized. This causes unevenness in the properties of the sealant, and, in some cases, damages the sealant due to large thermal stress. Therefore, the substrate 59 is once pre-heated at a temperature below the critical temperature at which the sealant is hardly set. In general, in order to perform the pre-heating, temperatures of the hot plates 60 are increased stepwise in the arranged order of the hot plates 60 from the loading port 40.

In the past, in order to obtain necessary temperature and time for heating and to supply the substrates 59 in an interval required by a product line, the temperature and the number of hot plates 60 in the pre-heating portion were determined based on a condition such as holding time which was determined by the temperatures increased stepwise in arranged order of the hot plates from the loading port and the interval transferring the substrates 59. The temperature and the number of hot plates 60 in the heating portion at a desired temperature above the critical temperature were determined based on a condition such as holding time which was determined by the holding temperature and the interval transferring the substrates 59.

In the conventional heating furnace shown in FIG. 12 and FIG. 13, the hot plate 60a is a portion for pre-heating and the temperature is lower then the critical temperature. The hot plates 60b and 60c are portions for heating (regular heating) at a desired temperature above the critical temperature and the temperatures are maintained at the same desired temperature above the critical temperature.

Operation of heating and setting the sealant applied onto the substrate 59 will be described below.

Initially, as the substrate 59 is mounted on the loading portion 40, the motor 50 is started rotating to transfer the cam 54 toward the loading portion 40, and at the same time the guide 55 is moved upward to lift the substrate transfer plate 57. In this course, the substrate transfer plate 57 takes and lifts the substrate 59 mounted on the loading portion 40 to remove the substrate 59 from the loading portion 40. As the substrate transfer plate 57 is lifted up to a given level, the motor 50 is stopped to hold the substrate transfer plate at the given level.

Next, the motor 45 is started rotating to transfer the substrate transfer plate 57 toward the unloading portion 42. Then, as the substrate 59 mounted on the substrate transfer plate 57 is transferred above the hot plate 60a, the motor 45 is stopped. In this state, the motor 50 is rotated in a direction reverse to the direction described above to move the cam 54 toward the loading portion 42 and to lower the substrate transfer plate 57 lower than the surface level of the hot plates 60, and is stopped. By doing so, the substrate 59 is mounted on the hot plate 60a.

After that, the motor 45 is rotated in a direction opposite to the direction described above to transfer the substrate transfer plate 57 toward the loading portion 40. As the substrate transfer plate 57 is returned to the original position, the motor 45 is stopped. Thus, the first operation is completed.

When the given time for pre-heating passes after completion of the first operation, the substrate transfer plate 57 is repeated the above operation and the second operation for transferring the substrate 59 from the hot plate 60a to the hot plate 60b is performed. Then, in the third operation the substrate 59 is transferred from the hot plate 60b to the hot plate 60c, and in the fourth operation after completion of heating the substrate 59 is unloaded from the hot plate 60c through the unloading portion 42.

In the conventional heating furnace, there are the following problems.

Since the substrate 59 has the sealant applied on the upper surface, the substrate 59 is supported on the bottom surface when it is transferred. Therefore, the hot plates 60 are designed so as to support the portion of the substrate not supported by the substrate transfer plate 57. Further, in order to cope with a substrate 59 having a different size, the substrate transfer plates 57 supporting the substrate 59 are movable on both sides laterally to the transferring direction of the substrate 59. Therefore, the hot plate 59 is limited in its width size in the direction perpendicular to the transferring direction of the substrate 59, and accordingly the area of the substrate 59 protruding from the hot plates 60 becomes large when the size of the substrate 59 is large. Consequently, it is difficult to raise the temperature in the peripheral protruding portions of substrate 59 is difficult to be raised, and when the substrate is detached from the surface of the hot plates 60, the temperature is further decreased since heat is removed from the substrate to the substrate transfer plate 57 by contacting the substrate 50 with the substrate transfer plate 57 during transferring the substrate 59. Since the furnace body case 44 contains the plurality of hot plates 60 having different heating temperatures and the substrate transfer plate 57 and its driving parts, the volume and the height of the furnace body case are large and there is a large temperature difference inside the furnace case 44, which causes convection inside the whole of the furnace body case 44. This convection is easily disturbed by vertical and horizontal motion of the substrate transfer plate 57, and thereby the surface temperature of the substrate 59 transferred between the hot plates 60 cannot be maintained constant and the sealant is unevenly set.

Furthermore, since the substrate 59 frequently contacts the substrate transfer plate 57 and the hot plates 60, production of dust is increased. In order to prevent temperature decrease of the substrate, it is desirable to shorten the time of transferring the substrate between the hot plates 60. However, if the substrate 59 is transferred between the hot plates 60 at a high speed, gas flow inside the furnace body 41 is largely disturbed which raises a cloud of dust in the furnace body 41, which degrades the cleanness further. Since the driving mechanism of the substrate transfer plate 57 is contained inside the same furnace case 44 together with the hot plates 60 and outside air enters into the furnace case 44 due to the convection, the cleanness is degraded. By the above phenomena, dust attaches to the substrate 59, and the quality of the substrate 59 is degraded.

Still further, in order to keep an amount of the substrates 59 after thermo-setting the sealant by adding desired heat which is supplied to a downstream apparatus connected to the heating furnace, the length of the furnace body becomes longer and accordingly a large installing area is required, and particularly the installing area becomes a problem since the manufacturing apparatus of substrates 59 is often installed in a clean room.

The same problem arises in baking of conductive paste in a printed circuit board.

Further, in a case where the substrate 59 is large in size and thick in thickness, it has been confirmed that when the substrate 59 is mounted on and heated by the hot plates 60, a temperature difference between the top surface and the bottom surface of the substrate 59 is produced and thereby the substrate 59 is warped on the hot plates 60, which causes difficulty of uniform heating.

An object of the present invention is to provide a heating furnace which can solve the aforementioned problems with the known heating furnaces, and which can uniformly thermo-set the sealant or the paste applied onto a surface of a substrate, and which can obtain a high quality substrate, and which can be installed in a small area.

In order to attain the above object, the present invention provides a heating furnace for heating a substrate mounted on a heating plate, which comprises a plurality of small holes passing through the heating plate, a substrate holder comprising a plurality of small diameter rods penetrating the small holes and projectable upwardly from the heating plate, an up-and-down driver for moving the substrate holder up an down, a substrate holder controller for controlling the length of the substrate holder projecting upward from the heating plate and controlling temperature of the heating plate to each of a pre-heating, a regular heating and a cooling temperatures, a vessel containing the heating plate and the substrate holder, and blocking outside air, an opening port being provided on one plane of said vessel, the substrate being transferred in the horizontal direction through the opening port to be mounted on the substrate holder inside the vessel.

Further, a surface of the vessel facing the heating plate is made of a mirror surface or a heat resistive mirror.

Since the substrate holder is composed of a plurality of small diameter rods penetrating the heating plate, the area of the heating plate can be made wide and the whole surface of the substrate can contact the surface of the heating plate, and consequently the whole surface of the substrate can be uniformly heated through thermal conduction.

Further, since the pre-heating, regular heating and cooling of the substrate can be performed on the single heating plate and by only one operation of loading and unloading, the total volume and the inner height of the vessel can be decreased. Therefore, the temperature distribution inside the vessel becomes uniform and the temperature difference becomes small, and consequently the occurrence of convection is decreased and the heating temperature is stabilized. Production of dust due to friction can be minimized since the contact area between the substrate holder and the substrate is very small, and the disturbance of gas flow around the heating plate during loading the substrate can be minimized since mounting of the substrate onto the heating plate is performed from the pre-heating position close to the heating plate, and further a cloud of dust is not raised and a decrease of cleanness can be prevented since convection inside the vessel is suppressed.

Furthermore, far-infrared rays emitted from the heating plate pass once through the glass substrate while a part of the far-infrared rays are absorbed in the substrate and members arranged on the top surface of the substrate, and then are reflected on the inner surfaces of the vessel and reach the top surface of the substrate to be absorbed in the members arranged on the top surface of the substrate. The members are heated and the heat is transferred to the top surface of the substrate and accordingly the top surface of the substrate is also heated. Therefore, the temperature difference between the top and bottom surfaces is decreased and warp in the substrate is decreased, thus uniform heating is attained. At that time, the far-infrared rays are reflected on the inner surface of the vessel and pass through the glass substrate and then return to the heating plate to heat the heating plate itself. Therefore, the returned heat decreases the heat energy to be generated by the heating plate itself, and accordingly there is an advantage in saving-energy.

Other objects, advantages and novel features of the present invention will become apparent from the following detailed description of the invention when considered in conjunction with the accompanying drawings.

DETAILED DESCRIPTION OF THE DRAWINGS

Figure 1:
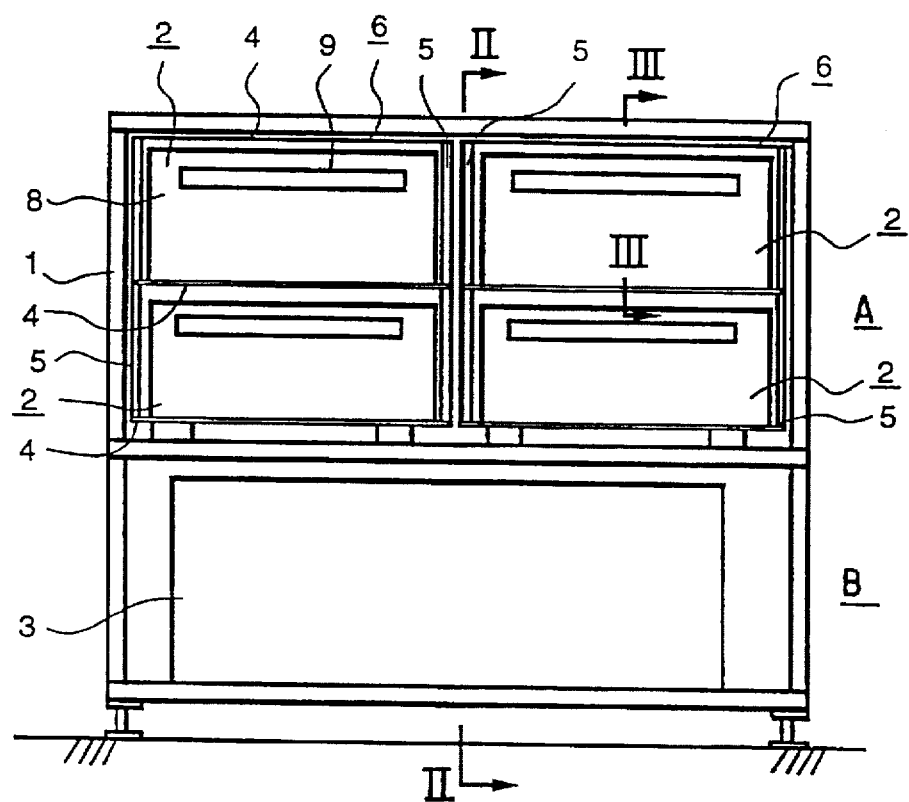
FIG. 1 is a front view showing one embodiment of a heating furnace in accordance a preferred embodiment of the present invention.

FIG. 1 is a front view showing one embodiment of a heating furnace in accordance with the present invention. The reference character 1 is a rack frame, the reference character 2 is a furnace body, the reference character 3 is a control unit, the reference characters 4 are base plates, the reference characters 5 are support pillars, the reference character 6 is a frame set, the reference character 8 is an isolation wall, and the reference character 9 is an opening port.

Figure 2:
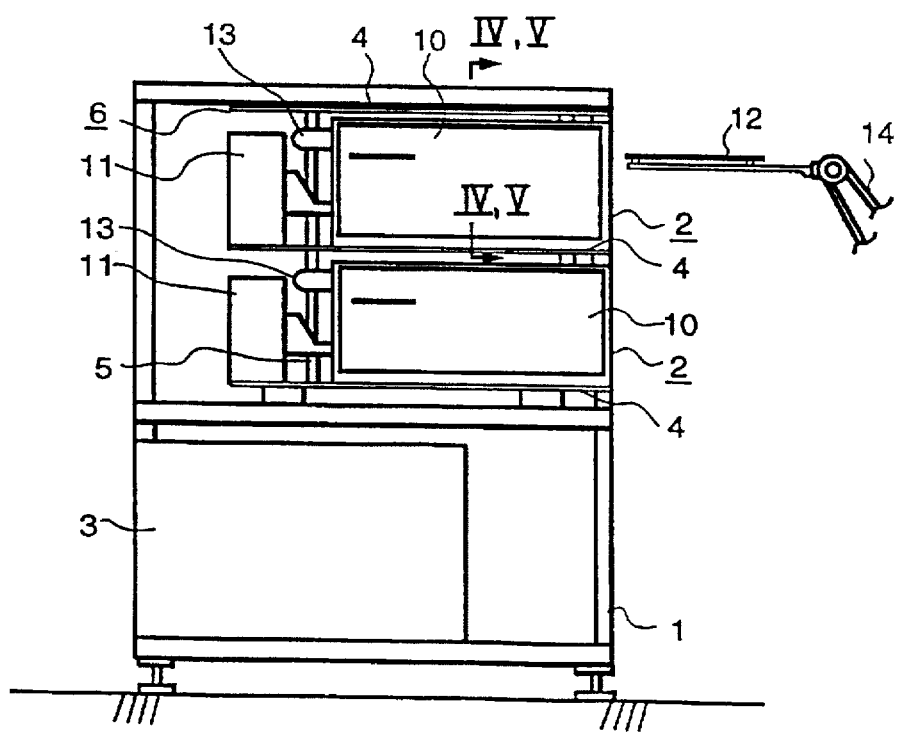
FIG. 2 is a cross-sectional view being taken on the plane of the line II—II of FIG. 1.

FIG. 2 is a cross-sectional view being taken on the plane of the line II—II of FIG. 1. The reference character 10 is a door inspection door, the reference characters 11 are up-and-down drivers, the reference character 12 is a substrate, the reference character 13 is a gas exhaust pipe, and the reference character 14 is a transfer robot. The parts corresponding to those in FIG. 1 are identified by the same reference characters.

Figure 3:
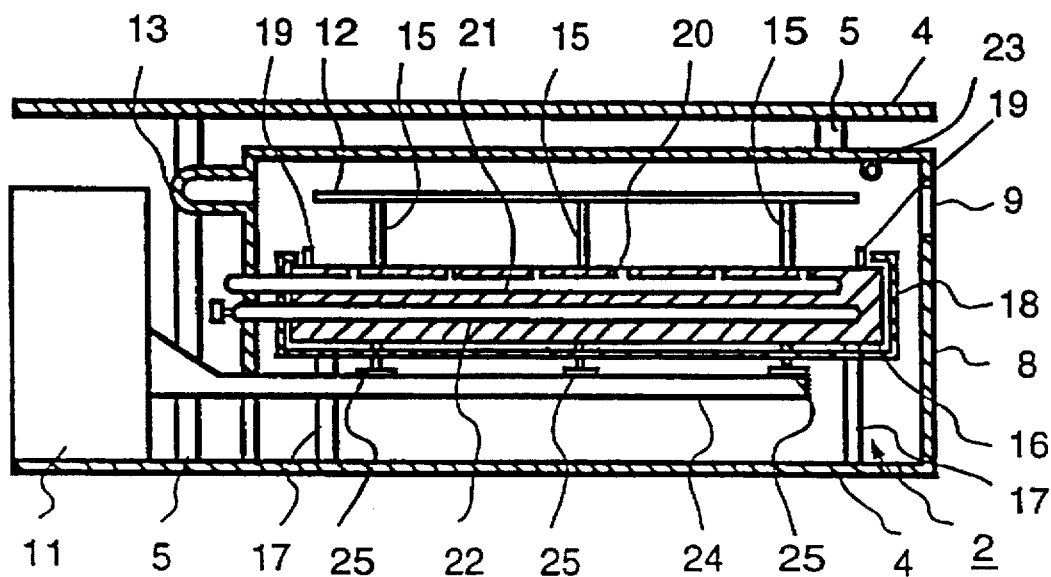
FIG. 3 is a cross-sectional view of the main portion being taken on the plane of the line II—II of FIG. 1.

FIG. 3 is a cross-sectional view of the main portion being taken on the plane of the line III—III of FIG. 1. The reference character 15 is an up-and-down moving pin, the reference character 16 is a hot plate, the reference character 17 is a support pillar, the reference character 18 is a heat dissipation preventive cover, the reference character 19 is a position displacing preventing pin (guide), the reference character 20 is a vacuum attracting hole, the reference character 21 is a vacuum pipe, the reference character 22 is a heater, the reference character 23 is a gas supply pipe, the reference character 24 is a vertical direction driving plate, and the reference character 25 is a lateral frame. The parts corresponding to those in the precedent figures are identified by the same reference characters.

Figure 4:
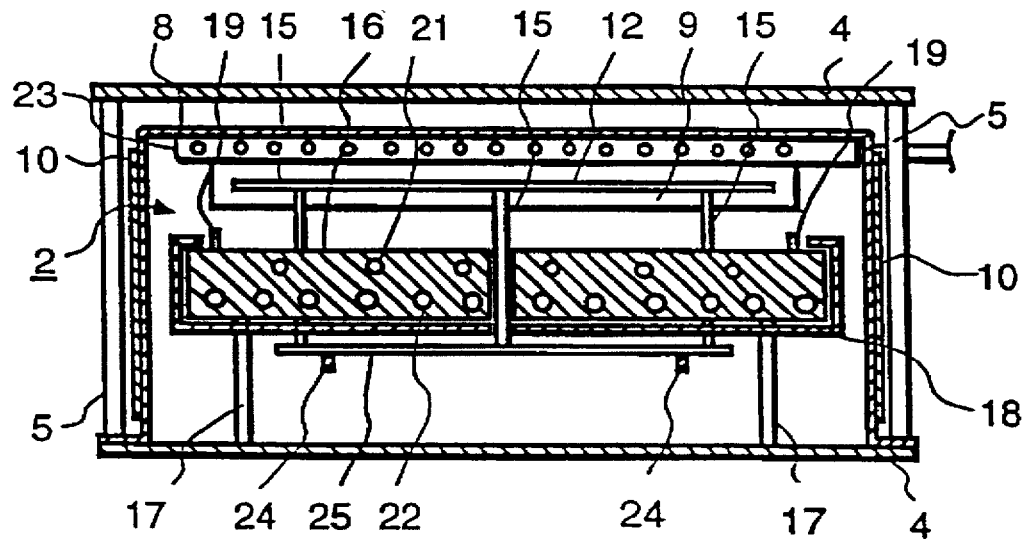
FIG. 4 is a cross-sectional view of the main portion being taken on the plane of the line IV—IV of FIG. 2.
Figure 5A:
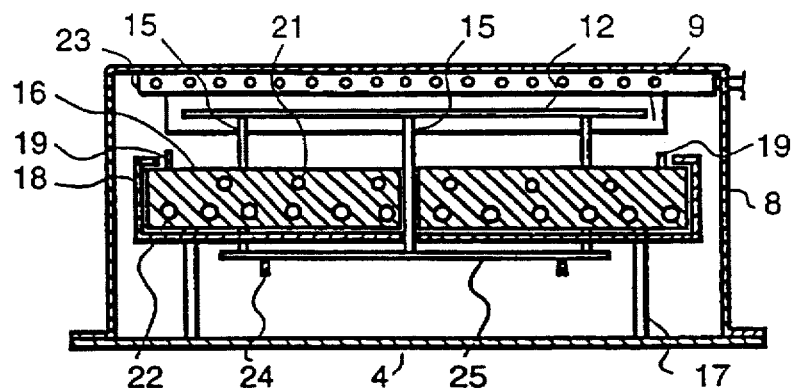
FIGS. 5(a)-5(d) is a view similar to FIG. 4 showing and explaining the operation of the embodiment shown in FIG. 1.
Figure 5B:
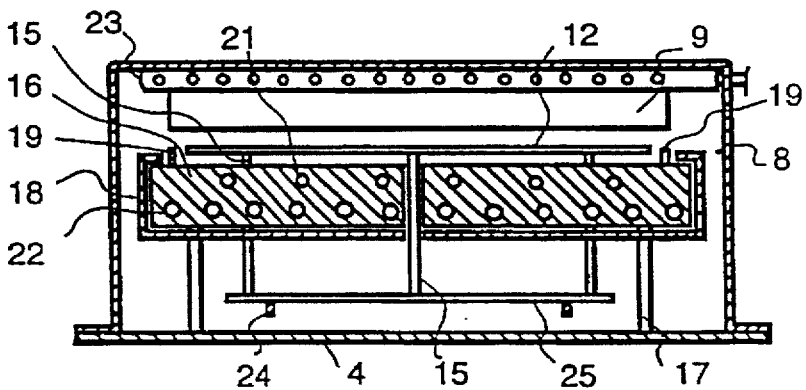
Figure 5C:
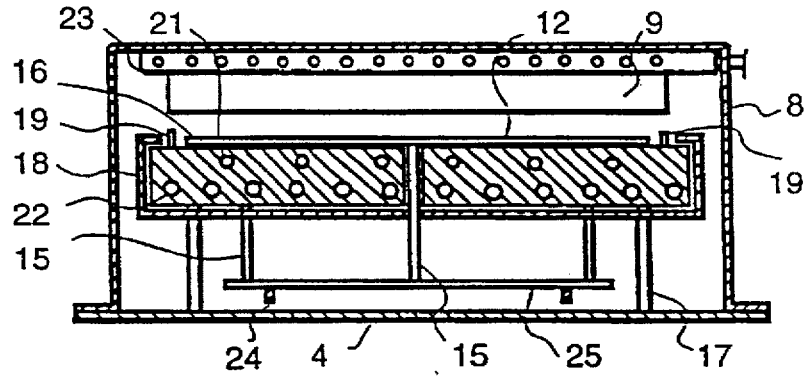
Figure 5D:
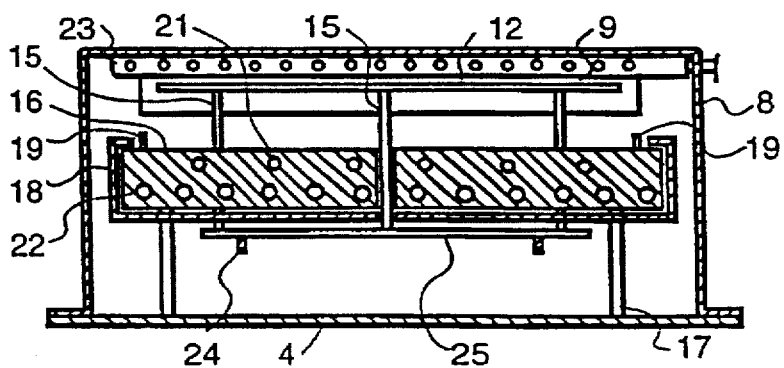

FIG. 4 is a cross-sectional view of the main portion being taken on the plane of the line IV—IV of FIG. 2, and the parts corresponding to those in the precedent figures are identified by the same reference characters.

Referring to FIG. 1 and FIG. 2, the heating furnace in this embodiment is placed on a floor by a rack frame 1 having legs. The rack frame 1 is divided into an upper stage and a lower stage a space portion A containing a furnace 2 for performing heating and a space portion B containing the control unit 3 composed of a substrate temperature control, a substrate holder moving up and down a substrate 12, to to be described later, and a control for the whole heating furnace.

In the upper space portion A of the rack frame 1, two frame sets 6 composed of the base plates 4 arranged in the horizontal direction and pillars 5 arranged in the vertical direction, and the frames are arranged in the horizontal direction. In one frame set 6, the base plate 4 in the upper side of the upper space portion A, the base plate 4 in the bottom side and the base plate 4 between them are arranged in parallel to one another and each of the base plates is supported in both of the right and left ends by the pillars 5. One of the frame sets 6 forms two spaces, that is, the upper and the lower spaces, and the furnace 2 is installed in each of the spaces. Therefore, four of the furnace bodies 2 are installed in the upper space portion I of the rack frame 1, that is, two furnace bodies in the upper side and two furnace bodies in the lower side.

A heating portion of the furnace body 2 is covered by a vessel-shaped isolating wall 8, and the bottom of the isolation wall is fixed to the base plate 4. The opening port 9 for loading and unloading the substrate is provided in the isolation wall 8, as shown in FIG. 2. The inspection 10 are detachably provided in the both sides of the vessel formed by the isolation wall 8, as shown in FIG. 2. Since the inspection door 10 in one side of the isolation wall 8 is in the outer surface side of the heating furnace, maintenance of the furnace body 2 can be performed by taking off the inspection door 10.

The up-and-down driver 11 is provided in each furnace body 2 and is fixed to each of the base plates 4. The up-and-down driver 11 has a reciprocal moving mechanism comprising a driving motor, a ball screw and other components on which are not shown in the figure, and its operation is controlled by the control unit 3. The vertical direction driving plate 24 extending inside the furnace body 2 is linked to the up-and-down driver 11 to be driven in the vertical direction by the reciprocal moving mechanism, as shown in FIG. 3.

Inside the furnace body 2, a plurality of lateral frames 25 are attached to the vertical direction driving plate 24 and the up-and-down moving pins 15 are attached onto the lateral frames 25. The up-and-down moving pins 15 are small diameter rod-shaped pins which are the substrate 12 holder. Inside the furnace body 2, the hot plate 16 is arranged as a heating plate for heating the substrate 12 by contact therewith, and the hot plate 16 is fixed to the base plate 4 through the pillars 17.

Outside the hot plate 16, the heat dissipation preventive cover 18 is provided. The heat dissipation preventive cover 18 is formed of a metallic plate such as a stainless steel plate, and covers the hot plate 16 at a small distance apart from it. Thereby, an air gap is formed between the hot plate 16 and the heat dissipation preventive cover 18 to stabilize the temperature of the hot plate 16 by suppressing heat dissipation of the hot plate 16. Small holes are provided vertically penetrating through the hot plate 16 and the heat dissipation preventive cover 18.

The substrate 12 is mounted on the plurality of up-and-down moving pins 15 above the hot plate 16. The up-and-down moving pins 15 are provided in such a proper arrangement as to cope with all shapes of the substrates 12 to be processed, and the up-and-down moving pins 15 are designed so that the lengths of the pins projecting from the surface of the hot plate 16 are equal to one another. The positional relationship between the opening port 9 provided in the isolation wall 8 and the up-and-down moving pins 15 is set so that the substrate 12 is mounted on the up-and-down moving pins 15 at a level as it is when the substrate 12 is horizontally transferred through the opening port 9 and loaded into the furnace body 2.

Movable parts inside the furnace body 2 are the vertical direction driving plate 24 and the up-and-down moving pins 15 moved up-and-down by the up-and-down driver 11. The up-and-down driver 11 is arranged outside the furnace body 2 and the substrate 12 is loaded by being horizontally transferred through the opening port 9. Therefore, a necessary space inside the furnace body 2 is a moving region for the vertical direction driving plate 24 and the up-and-down moving pins 15 and a space for transferring the substrate 12. Thereby, the height of the isolation wall 8 can be reduced.

On the top surface of the hot plate 16, there are provided the substrate 12 displacement preventing pins (guide) 19 and a plurality of the vacuum attracting holes 20 arranged in a certain spacing. The substrate 12 displacement preventing pins (guide) 19 are rod-shaped or block-shaped members detachably fixed to the hot plate 16 so as to adjust the fixed position depending on a shape of the substrate 12 and are arranged so as to surround around the substrate 12 to be mounted, for example, arranged in four sides of a rectangle when the substrate 12 is rectangular.

Inside of the hot plate 16, the heater 22 for heating and the vacuum attaching holes 20 connected to the vacuum pipe 21 are provided. The vacuum pipe is further connected to a vacuum pump (not shown) driven and controlled by the control unit 3.

In the side of the opening port 9 in the upper portion inside the furnace body 2, the gas supply pipe 23 is provided as a gas supplying means. The gas supply pipe 23 is a pipe-shaped member having many nozzles which are directed in the nearly horizontal direction opposite to the opening port 9. A gas (for example, nitrogen gas) is introduced in the gas supply pipe 23 to be supplied into the furnace body 2 through the nozzles.

In the face of the isolation wall 8 opposite to the opening port 9, the gas exhaust pipe 13 is provided for exhausting dust produced in the furnace body 2 and a gas generated by setting treatment of the sealant. In order to increase pressure inside the furnace body 2, the exhausting rate of gas through the exhaust pipe 13 is set to a value smaller than the supplying rate of nitrogen gas through the gas supply pipe 23.

As shown in FIG. 2, the substrate 12 is loaded from the outside into the furnace body 2 and unloaded from the furnace from body 2 to the outside using the transferring robot 14 which comprises a transfer head having a shape shown in the figure and is operated by being controlled by the control unit 3 in coupling with the operation of the up-and-down moving pins 15.

Operation of the embodiment having the aforementioned structure will be described below, referring to FIGS. 5(a)–5(d). FIG. 5(a) to FIG. 5(d) is a view showing the opening port 9 side seeing from the line V—V of FIG. 2 and explaining the operation of the embodiment shown in FIG. 1.

As shown in FIG. 5 (a), initially, the substrate 12 is horizontally transferred into the furnace body 2 through the opening port 9 by the transfer robot 14 (FIG. 2) and mounted on the up-and-down moving pins 15 which are in a raised position. At this time, the hot plate 16 is maintained at a desired temperature exceeding the critical temperature at which the sealant applied to the substrate 12 is rapidly set. Since the hot plate 16 is isolated from outside air by the isolation wall 8, its temperature is stabilized and the temperature inside the furnace body is maintained at a temperature higher than outside temperature by heat of the hot plate 16.

The gas supply pipe 23 always blows nitrogen gas at room temperature in a nearly horizontal direction toward the opposite side of the opening port 9 through the nozzles. The nitrogen gas supplied from the nozzle of the supply pipe 23 is highly clean and the high cleanness inside the furnace body 2 is maintained by this supplied nitrogen gas. The exhaust gas pipe 13 (FIG. 2) always exhausts the gas inside the furnace body 2 and a small amount of dust produced in the furnace body 2 and the gas generated by heating of the sealant.

As the substrate 12 is transferred into the furnace body 2, the surface temperature of the substrate 12 is raised by radiation heat from the hot plate 16 and gas temperature inside the furnace body 2. In this moment, the gap between the substrate 12 and the hot plate 16 is set to a predetermined distance depending on the temperature of the hot plate 16 and the sealant used.

Next, as shown in FIG. 5 (b), the up-and-down moving pins 15 are moved downward by the up-and-down driver 11 and the substrate 12 is brought and kept close to the hot plate 12. At this time, the gap between the substrate 12 and the hot plate 16 is set to a different distance depending on a desired pre-heating temperature. In this state, the substrate is heated by radiation heat of the hot plate 16. Although the temperature of the substrate 12 is further raised, the temperature does not reach up to the surface temperature of the hot plate 16 since the substrate 12 is apart from the hot plate 16. Therefore, the substrate 12 can be heated at the desired temperature by adjusting the distance between the substrate 12 and the hot plate 16. When the temperature of the substrate 12 reaches to the desired temperature, the up-and-down moving pins 15 are further moved downward and the aforementioned vacuum pump connected to the vacuum pipe 21 is started operating to suck gas from the vacuum attracting holes 20.

Then, as shown in FIG. 5 (c), by moving the up-and-down moving pins 15 downward further, the substrate 12 is moved down surrounded by the displacement preventing pins (guide) 19 and mounted on the hot plate 16 at last. As the vacuum attracting holes 20 are operated, the substrate 12 is vacuum-attracted and closely fixed to the hot plate 16. Even if the substrate 12 is warped, the gap between the substrate 12 and the hot plate 16 is eliminated and the substrate 12 does not displace during regular heating.

The whole surface of the substrate 12 is difficult to contact to the hot plate 16 at a time due to warp of the substrate 12 and working accuracy of the hot plate 16 and the up-and-down moving pins 15. Therefore, a portion of the substrate 12 which contacts the hot plate first is attracted to the vacuum attracting holes 20 and at the same time the substrate 12 is apt to move from its mounted position. However, since the substrate 12 is surrounded by the displacement preventing pins (guide) 19, displacement of the substrate 12 can be mechanically limited within a desired range. The substrate 12 is attracted and held to the hot plate 16 for a desired period.

Since the substrate 12 contacts the hot plate 16, the whole surface temperature of the substrate 12 becomes uniform by thermal conduction heating. Thereby, the sealant applied to the substrate 12 is uniformly thermo-set.

After the substrate 12 is held on the hot plate 16 for a desired period, attraction by the vacuum attracting holes 20 is stopped and the up-and-down moving pins 15 are moved upward, and the substrate 12 is returned to and held at the position where the substrate 12 has been mounted on the up-and-down moving pins 15, as shown in FIG. 5 (d). During this time, the substrate 12 detaches from the hot plate 16 and the temperature of the substrate 12 gradually decreases.

Further, as the substrate 12 detaches from the hot plate 16, nitrogen gas blown out from the nozzles of the gas supply pipe 23 blows on the surface of the substrate 12, and thereby cooling of the substrate 12 is accelerated. The cooling of the nitrogen gas prevents progressing of setting of the sealant by residual heat.

The time sequence of each position of the up-and-down moving pins shown in FIGS. 5 (a) to (d) depends on various conditions such as the characteristic of the sealant applied to the substrate 12, the set temperature of the hot plate 16 and so on. As the temperature of the substrate reaches to the desired value and cooling is completed, the substrate is unloaded outside the furnace body 12 using the transfer robot 14 (FIG. 2) and thus thermo-setting treatment of the sealant of the substrate 12 is completed.

The substrate 12 can be pre-heated at a temperature below the critical temperature by pre-heating the substrate 12 at a position apart from the hot plate 16, and the time period of the substrate attaching to the hot plate 12 can be adjusted, and the desired characteristic of the sealant can be obtained by detaching the substrate 12 from the hot plate 16 and cooling it to a temperature below the critical temperature.

Since the hot plate 16 is hardly affected by outer air by covering the hot plate 16 with the isolation wall 8 and the substrate 12 can be uniformly heated by stabilizing the surface temperature of the hot plate 16, the sealant applied to the substrate 12 can be uniformly thermo-set.

Since the up-and-down driver 11 for moving the up-and-down moving pins 15 is only one driving mechanism inside the furnace body 2, the construction of the furnace body can be simplified. Since control of the driving mechanism in the furnace body 2 is only a vertical positioning of the up-and-down moving pins 15, the control is simplified. Since the transfer robot 14 loads the substrate 12 through the opening port 9 provided in the front face portion of the isolation wall 8 to mount it on the up-and-down moving pins 15 and unloads the substrate 12 after completion of heating from the up-and-down moving pins 15 which are placed at the same position as the loading position, the control is easy.

Figure 10:
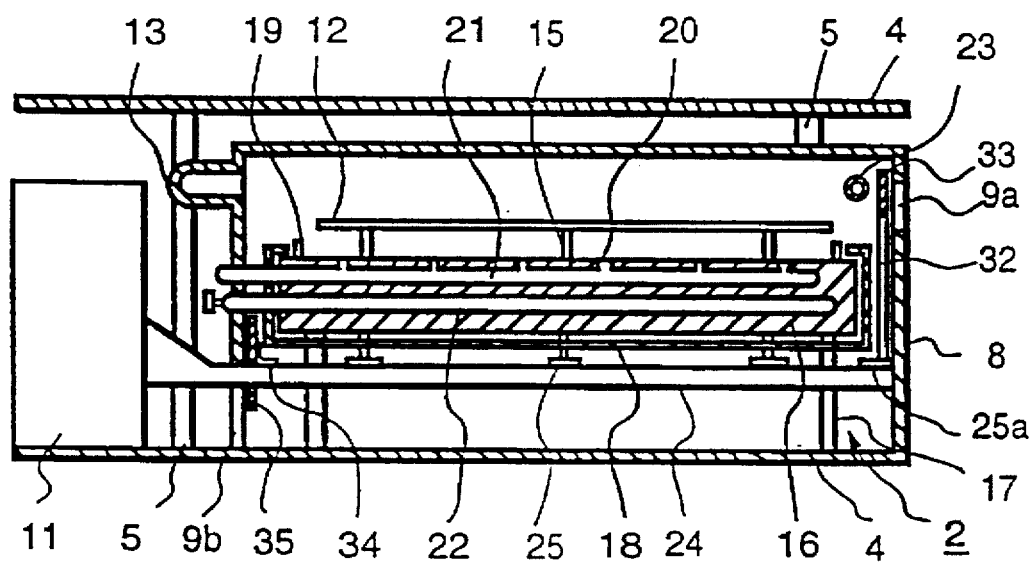
FIG. 10 is a cross-sectional view showing another embodiment of a heating furnace different from FIG. 1.

Inside the furnace body 2, a gas flow occurs which is formed by low temperature gas entering through a cut portion, i.e. an opening port 9bas shown in FIG. 10, in the isolation wall 8 in the up-and-down range of the vertical driving plate 24 in the bottom portion of the furnace body and flowing along the top surface of the hot plate 16 and flowing out through the opening port 9. However, since the nozzles of the gas supply pipe 23 are provided so as to blow a gas in nearly horizontal direction toward the opposite side of the opening port 9, the gas flowing toward the opening port 9 is counteracted.

Further, since the pressure inside the furnace body 2 is slightly increased by the nitrogen gas supplied from the gas supply pipe 23, an air flow entering from the outside of the isolation wall 8 is eliminated. Since the volume surrounded by the isolation wall 8 is suppressed smaller and accordingly the space around the hot plate 16 is small, the temperature inside the furnace body can be easily uniformly maintained by heat of the hot plate 16 and the temperature difference between the upper portion and the lower portion in the furnace body 2 can be reduced. Therefore, the convection inside the furnace body 2 can be suppressed to a weak intensity. Since the convection is not disturbed by motion of the substrate 12, the heating temperature of the hot plate 16 becomes uniform and consequently the sealant applied to the substrate 12 can be uniformly thermo-set.

Since an inert gas of nitrogen gas is used for the gas supplied from the gas supply pipe 23 and prevents the outside gas from entering into the furnace body 2, oxidation of the sealant can be prevented.

The nozzles of the gas supply pipe 23 are provided so as to blow a gas in a nearly horizontal direction toward the opposite side of the opening port 9. The direction of the nozzles and the flow rate of the gas supply pipe 23 may be optimized depending on the direction and the intensity of convective flow produced by the position of the opening port 9 of the isolation wall 8 and the position and the temperature of the hot plate 16. For example, in a case where the total height of the isolation wall 8 is low enough to suppress the convection inside the furnace body, a gas curtain may be formed by producing a gas flow flowing along the opening port 9 of the isolation wall 8 to suppress entering of the outside air.

In this embodiment, four furnace bodies are used. The required number of the furnace bodies is determined from a value which is obtained by dividing the sum of the existing time of the substrate 12 inside the furnace body 2 and the loading and unloading time of the substrate 12 into and out of the furnace body 2 by a desired supplying time of the substrate 12. By loading the substrates 12 into each of the furnace bodies 2 in a certain time interval one by one, the substrates 12 having a completed thermo-setting treatment of the sealant can be supplied to the next process in the certain time interval one by one. Therefore, by providing a plurality of the furnace bodies 2, it is possible to maintain a necessary time interval for supplying the substrates 12 to an apparatus in the next process.

Even if one of the plurality of the furnace bodies 2 fails, by controlling the temperature of the furnace bodies individually, it is possible to operate the other furnace bodies 2 and to perform the maintenance on the failed one without shutting down the production line.

Since the inspection door 10 (FIG. 2 and FIG. 4) for maintenance and inspection is provided in a side face perpendicular to the face loading the substrate 12, even when one side of the inspection doors 10 is opened to perform maintenance or inspection, loading of the substrate 12 into the furnace bodies 2 except for one on which maintenance or inspection is being performed is not hindered and there is no need to shut down the whole furnace.

Although the furnace bodies 2 are arranged in two columns and two rows in this embodiment, arrangement of the furnace bodies 2 may be changed according to combination with the transfer robot 14 for transferring the substrates 12. The furnace bodies may be arranged only in the vertical direction, or the furnace bodies may be arranged only in the horizontal direction. The arrangement of the furnace bodies 2 can be properly selected corresponding to the condition of floor area, the ceiling height of a room in which the furnace is, number of the furnace bodies and transfer range of the transfer robot 14 and so on. The total height of the furnace body 2 is low and accordingly when several number of the furnace bodies 2 are stacked vertically, the total height of the apparatus is not so high. Therefore, the installation area can be reduced.

Further, in this embodiment, outside air is prevented from entering into the furnace body 2 by suppressing convection, and dust is prevented from attaching to the substrate 12 by improving its cleanness. Since the substrate 12 touches the hot plate 16 only once during heating and the substrate 12 is mounted onto the hot plate 16 from the pre-heating position very near the hot plate, gas flow around the hot plate 16 is minimized and therefore a cloud of dust is little and the cleanness can be maintained.

Further, since the contact area between the substrate 12 and the up-and-down moving pins 15 is very small, production of dust by friction between the substrate 12 and the up-and-down moving pins 15 is suppressed. Since convection in the furnace body 12 is suppressed, produced dust is hardly transferred upward and the cleanness of the substrate 12, therefore, can be maintained. The up-and-down driver 11 as a driving unit is installed outside the isolation wall 8 and accordingly production of dust is small, and any dust produced is exhausted from the exhaust pipe 13. Therefore, the cleanness inside the furnace body 2 can be maintained in a good condition and it is possible to obtain a high quality substrate 12 having little attached dust.

Figure 6:
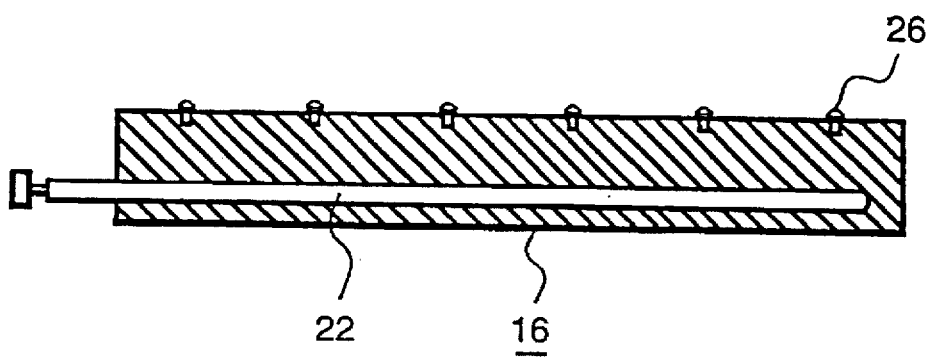
FIG. 6 is a vertical cross-sectional view showing another example of a hot plate in FIG. 1.

FIG. 6 is a vertical cross-sectional view showing a heater 22 which is another embodiment of a hot plate 16 used in the embodiment shown by FIG. 1, wherein the reference character 26 is a gap pin.

Referring to the figure, instead of the vacuum attracting holes 20 shown in FIG. 3, this hot plate 16 has many gap pins 26 arranged on the surface of the hot plate 16 to hold the substrate 12 slightly apart from the hot plate 16. The gap pins 26 are for holding the substrate 12 closer to the surface of hot plate 16 in a uniform spacing than the pre-heating position.

By constructing the hot plate in such a manner, the substrate can be uniformly heated by radiation heat and can obtain a uniform sealant characteristic.

Figure 7:
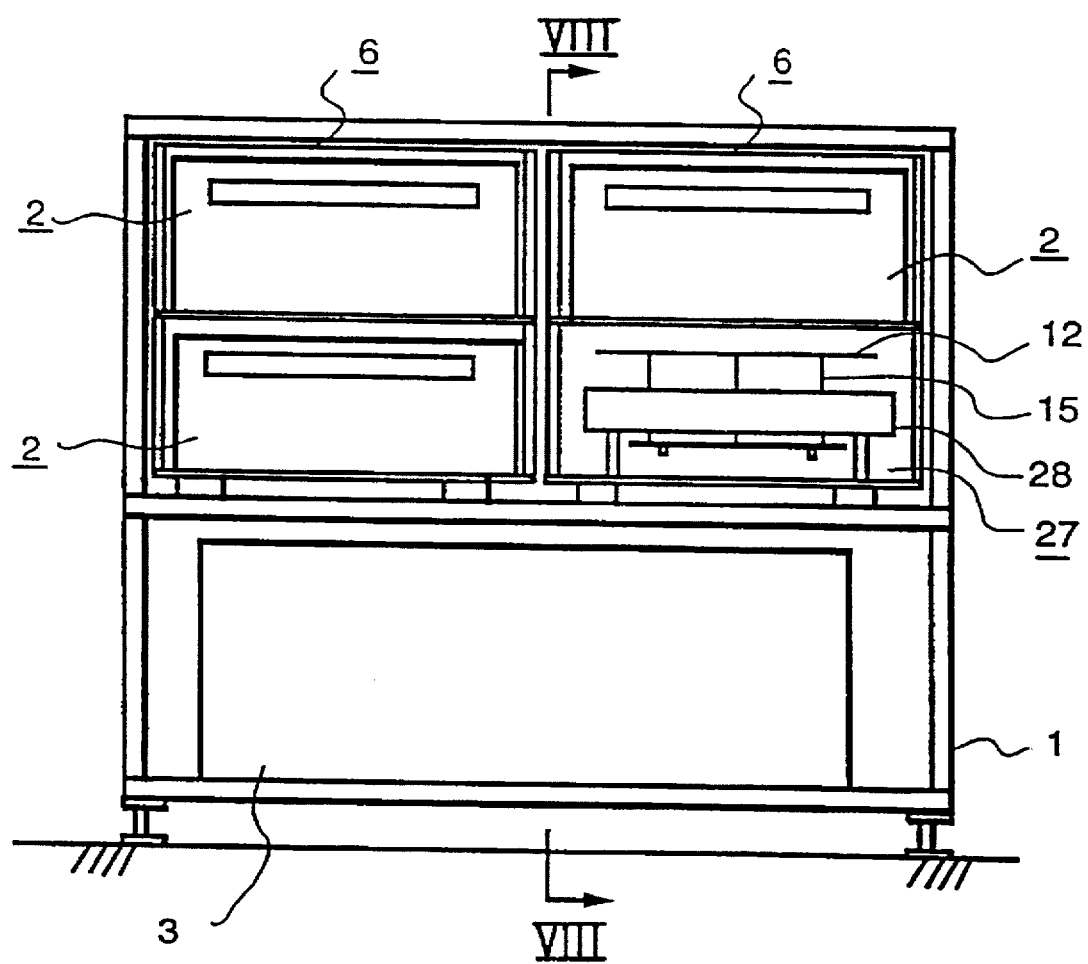
FIG. 7 is an outer front view showing another embodiment of a heating furnace in accordance with the present invention.

FIG. 7 is an outer front view showing another embodiment of a heating furnace in accordance with the present invention. The reference character 27 is a cooler and the reference character 28 is a cooling plate. The parts corresponding to those shown in the precedent figures are identified by the same reference characters and repeated description will be omitted here.

Figure 8:
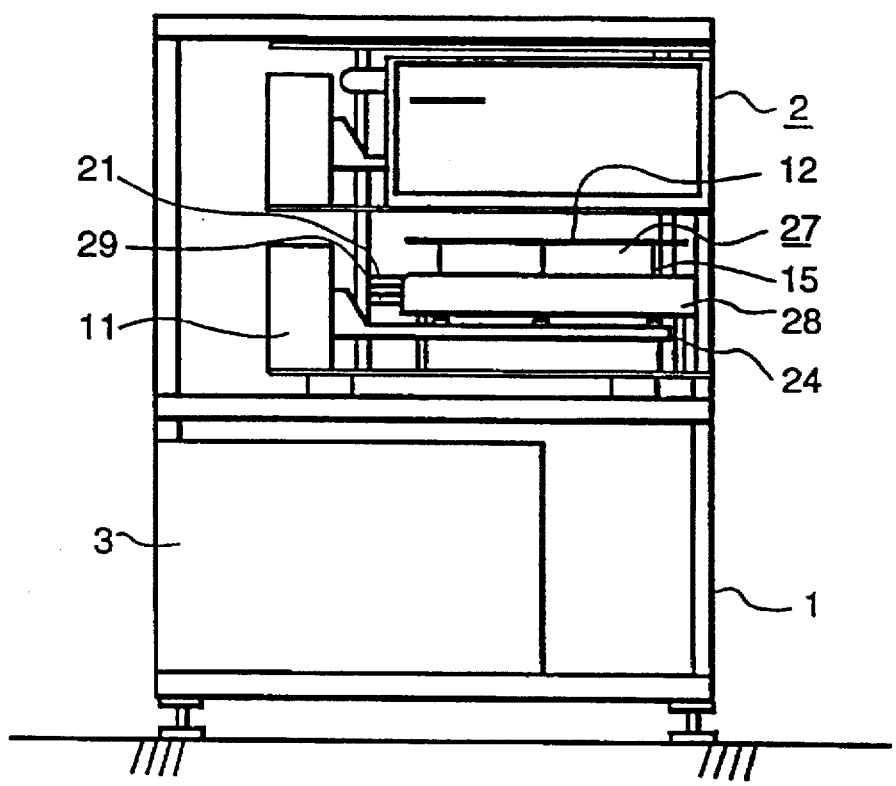
FIG. 8 is a cross-sectional view being taken on the plane of the line VIII—VIII of FIG. 7.

FIG. 8 is a cross-sectional view being taken on the plane of the line VIII—VIII of FIG. 7. The reference character 29 is a cooling water pipe and the parts corresponding to those shown in FIG. 7 are identified by the same reference characters.

The different point of this embodiment from the embodiment shown in FIG. 1 is that one of the four furnace bodies 2 shown in FIG. 1 is replaced by the cooler 27, as shown in FIG. 7.

The cooler 27 is, as shown in FIG. 7 and FIG. 8, constructed by removing the isolation wall 8 from the furnace body 2 and installing the cooling plate 28 in which the heater 22 of the hot plate 16 is replaced by the cooling water pipe 29. The cooling water pipe 29 introduces cooling water in its inside to cool the cooling plate 28 down to room temperature. The cooler 27 is arranged in the frame 6 the same as the furnace body 2.

Operation of this embodiment will be described below.

The heating process using the furnace body 2 is nearly the same as the process of FIG. 5 (a) to FIG. 5 (d) showing the operation of the embodiment shown in FIG. 1. As the temperature of the substrate 12 is decreased lower than the desired temperature by blowing gas flow to the substrate 12 from the gas supply pipe 23 in the state of FIG. 5 (d), the substrate is unloaded from the furnace body 2 using the transfer robot 14 (FIG. 2) and transferred to the cooler 27 to be cooled.

In the cooler 27, the substrate 12 is mounted on the cooling plate 28 by moving the up-and-down moving pins 15 holding the substrate 12 downward using the up-and-down driver 11 and the substrate 12 is cooled.

The cooling plate 28 is always cooled by cooling water flowing in the cooling water pipe 29, and the whole surface of the substrate 12 is in contact with the cooling plate 28 and heat of the substrate 12 is removed by thermal conduction to rapidly decrease the temperature of the substrate 12. When the temperature of the substrate 12 is lowered to a desired temperature, the up-and-down moving pins 15 are moved upward again to hold the substrate 12 above the cooling plate 28 using the up-and-down moving pins 15. Then, the substrate 12 cooled down by the cooler 27 is unloaded outside the cooler 27 using the transfer robot 14 (FIG. 2). Thus the thermo-setting treatment is completed.

The cooler 27 in this embodiment is not limited to the construction shown in FIG. 8, and the other construction may be employed.

According to this embodiment, the sealant on the substrate is thermo-set at a high temperature in a short time, and then is forced to be cooled. Therefore, the time required for thermo-setting treatment is shortened and accordingly the substrate production capacity of the heating furnace can be improved.

Although all the up-and-down moving pins 15 have the same length in the aforementioned embodiments, the length of the up-and-down moving pins 15 arranged in the central portion of the hot plate 16 holding the central portion of the substrate 12 may be shorter than the length of the up-and-down moving pins 15 arranged in the peripheral portion of the hot plate 16. For an example, in a case where the substrate 12 is supported by five up-and-down moving pins 15, that is, one is in the central portion and the other four are in the four corners, the length of the up-and-down moving pins 15 in the central portion is slightly shorter than the length of the up-and-down moving pins 15 in the four corners. When the substrate is supported by the up-and-down moving pins 15, the force supporting the substrate 12 acting on each of the up-and-down pins 15 in the peripheral portion is large and equalized so that the substrate 12 is hardly displaced since the central portion of the substrate 12 is bent downward. When the substrate 12 is mounted on the hot plate 16, the central portion of the substrate 12 firstly contacts and is attracted by the hot plate 16. Therefore, displacement of the substrate 12 at mounting time can be suppressed.

Figure 9:
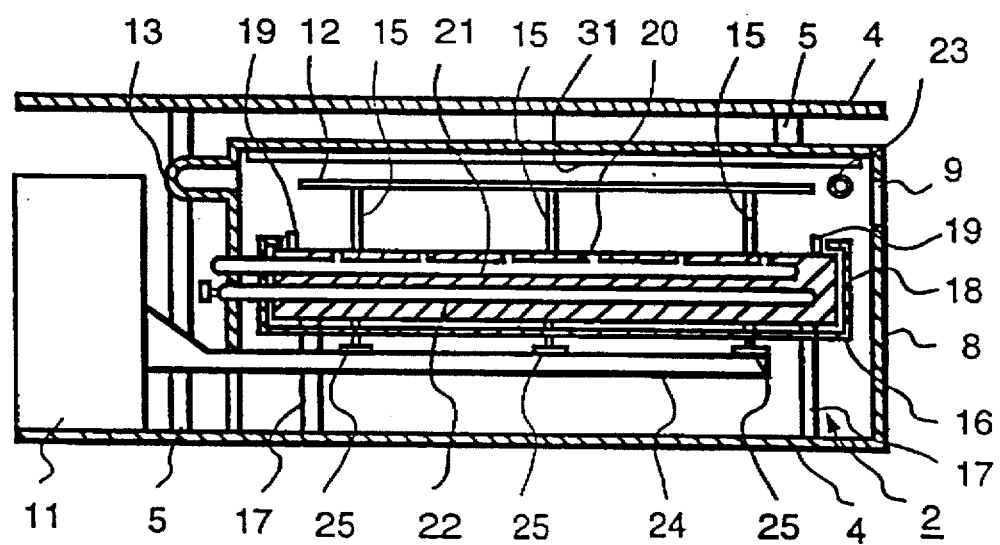
FIG. 9 is a cross-sectional view showing an embodiment of a heating furnace different from FIG. 1.

FIG. 9 is a cross-sectional view showing an embodiment of a heating furnace different from FIG. 1.

The different point of this embodiment from the embodiment of FIG. 1 is that a heat resistive mirror 31 is attached onto the inner surface of the furnace vessel facing the top surface of the hot plate 16 by hooks (not shown) instead of mirror polishing the inner surface.

Figure 11:
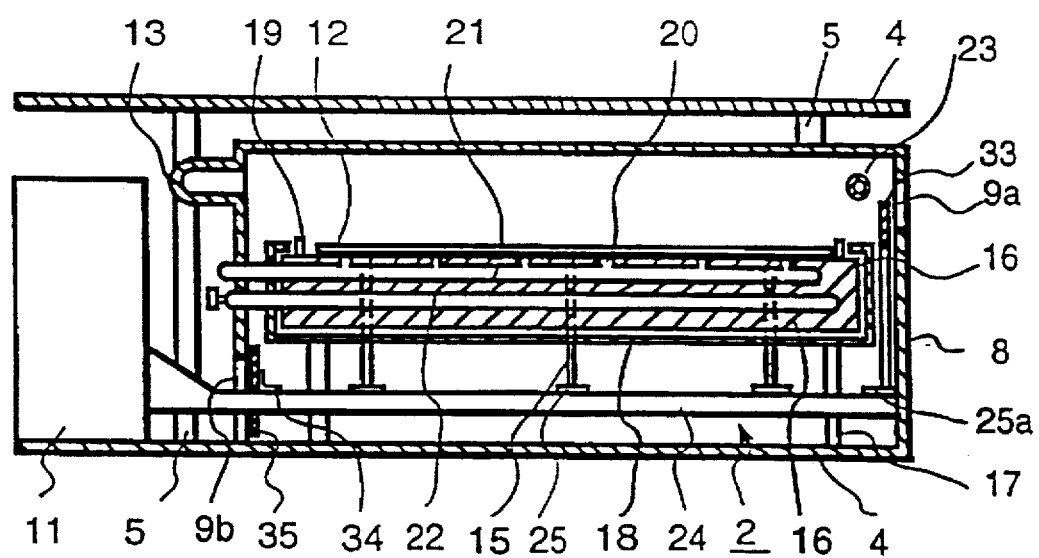
FIG. 11 is a cross-sectional view showing the operation of heating in the heating furnace shown in FIG. 10.
Figure 12:
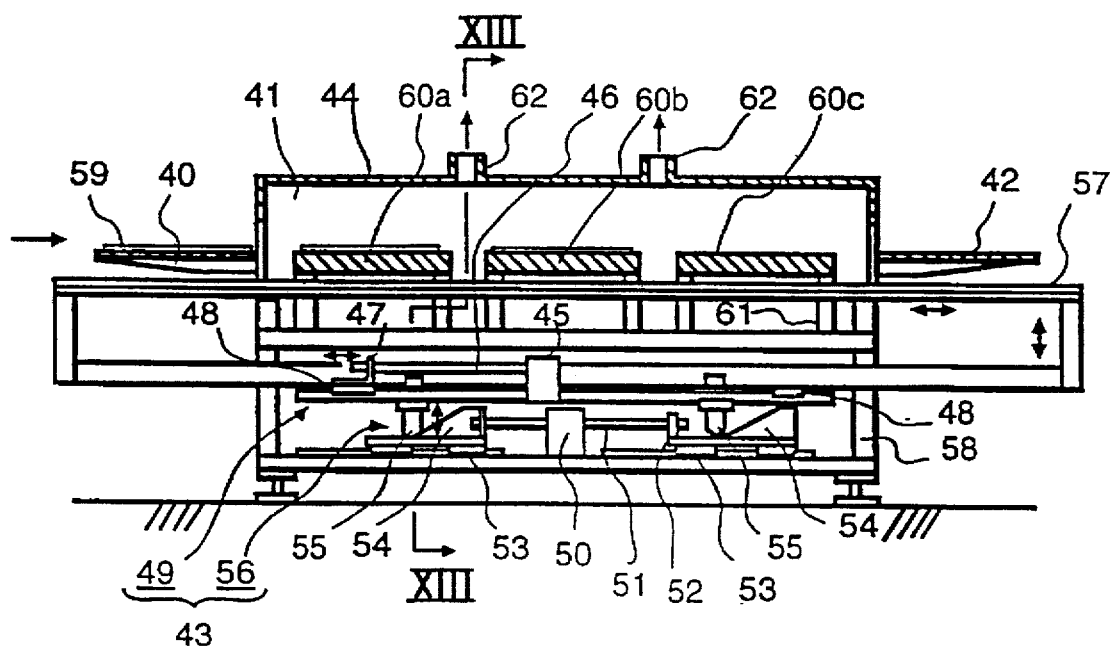
FIG. 12 is a vertical cross-sectional view showing an example of a conventional heating furnace.
Figure 13:
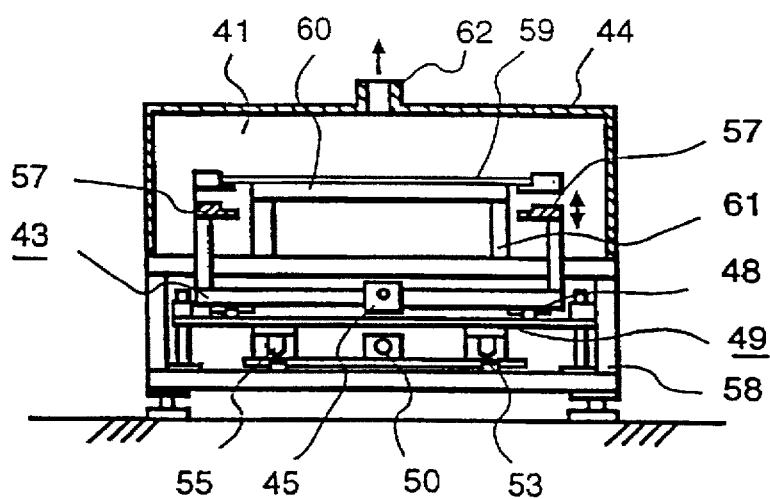
FIG. 13 is a cross-sectional view being taken on the plane of the line XIII—XIII of FIG. 12.

FIG. 10 and FIG. 11 show another embodiment.

FIG. 10 is a cross-sectional view showing the heating furnace. FIG. 11 is a cross-sectional view showing the operation of heating in the heating furnace.

The different point of this embodiment from the embodiment of FIG. 1 is that a shielding plate 33 is provided in the lateral frame 25a in the front side of the apparatus through a supporting pillar 32 and in the rear side a shielding plate 35 is provided in the vertical driving plates 24 through a supporting member 34 provided across the vertical driving plates.

When the substrate 12 is loaded onto the up-and-down moving pins 15 using the transfer robot shown in FIG. 2, the vertical driving plates 24 are in the upper position and accordingly the shielding plate 33 opens the opening port 9a for loading and unloading the substrate 12 provided in the front face of the isolation wall 8, as shown in FIG. 10.

When the substrate 12 is moved downward to be heated using the vertical driving plates 24 through the up-and-down pins 15 to be heated, the shielding plate 33 closes the opening port 9a for loading and unloading the substrate 12 provided in the front face of the isolation wall 8, as shown in FIG. 11, and the shielding plate 35 closes an up-and-down opening port 9b for the vertical driving plates in the rear face of the isolation wall 8.

By closing the openings 9a and 9b during heating, cold and dusty outside air hardly enters into the furnace, and uniform heating and high cleanness can be obtained. Further, high temperature nitrogen gas inside the furnace hardly flows to the outside and an amount of nitrogen gas supplied from the gas supply pipe 23 can be reduced. After heating, the openings 9a and 9b are opened and cold outside air flows into the furnace to cool the substrate 12.

Though the embodiments of the present invention have been described, the present invention is not limited to these embodiments.

Description has been made in taking a liquid crystal display panel and a plasma display panel as the embodiments, it is needless to say that the present invention can be applied to the burning of a conductive paste applied onto a substrate as far as the substrate is made of glass.

As described above, according to the present invention, it is possible to obtain a heating furnace which is capable of uniformly thermo-setting a paste applied onto the surface of a substrate, and manufacturing a high quality substrate and can be installed in a small area.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A heating furnace for heating a substrate, comprising:

a heating plate having a plurality of holes passing through the heating plate;

a substrate holder having a plurality of rods penetrating said holes and projectable upward from the heating plate;

an up-and-down driver configured to move said substrate holder and a substrate mounted on the substrate holder up and down;

means for adjusting a length of said rods projecting upward from the heating plate in order to adjust a distance of said substrate from the heating plate according to each of a pre-heating period, a regular heating period and a cooling period, wherein said means for adjusting adjusts the length of said rods to position said substrate at a pre-heating distance above the heating plate during said pre-heating period, said means for adjusting adjusts the length of said rods to position said substrate in contact with the heating plate during said regular heating period, and said means for adjusting adjusts the length of said rods to position said substrate at a cooling distance above the heating plate during said cooling period;

a vessel containing the heating plate and the substrate holder, and blocking outside air;

an opening port being provided in one plane of said vessel through which said substrate can be transferred in the horizontal direction to be mounted on said substrate holder inside the vessel.

2. A heating furnace according to claim 1, wherein a gas supply means is provided within said vessel near and above the opening port of the vessel, said gas supply means having at least one gas supply port facing opposite the opening port for discharge of a gas.

3. A heating furnace according to claim 1, wherein a door for exposing the inside of the vessel is provided in a plane intersecting the plane containing the opening port.

4. A heating furnace according to claim 1, wherein a length of the rods projecting upward from the heating plate in a central portion of the heating plate is less than a length of the rods projecting upward from the heating plate in a peripheral portion of the heating plate.

5. A heating furnace according to claim 1, wherein
at least an inner surface of said vessel facing the heating plate is a mirror surface.

6. A heating furnace according to claim 1, wherein
at least an inner surface of said vessel facing the heating plate is made of a heat resistive mirror.

7. A heating furnace according to claim 1, wherein
said substrate is made of glass.

8. A heating furnace according to claim 1, wherein said up-and-down driver extends into said vessel through an up-and-down opening port, and wherein
shield plates are provided in said opening port of said vessel and in said up-and-down opening port for said up-and-down driver, said shield plates opening and closing corresponding to moving-up and moving-down of said up-and-down driver.

9. A heating furnace according to claim 1, wherein said pre-heating distance and said cooling distance are selected based upon a desired pre-heating temperature of the substrate and a desired cooling temperature of the substrate, respectively.

10. A heating furnace according to claim 1, wherein said pre-heating period, said regular heating period, and said cooling period are selected based upon a desired pre-heating temperature, a desired regular heating temperature of the substrate, and a desired cooling temperature of the substrate, respectively.

11. A heating furnace for heating a substrate, comprising:
a heating plate which comprises a plurality of holes extending generally vertically through the heating plate;
a substrate holder comprising a plurality of rods penetrating said holes and projectable upward from the heating plate;
an up-and-down driver configured to move said substrate holder up and down; and
means for adjusting a length of said rods projecting upward from the heating plate according to each of a pre-heating period, a regular heating period and a cooling period, wherein said means for adjusting adjusts the length of said rods projecting upward from the heating plate to a pre-heating length during said pre-heating period, said means for adjusting adjusts the length of said rods projecting upward from the heating plate to zero during said regular heating period, and said means for adjusting adjusts the length of said rods projecting upward from the heating plate to a cooling length during said cooling period.

12. A heating furnace according to claim 11, wherein said heating plate further comprises additional holes which are configured to communicate with an upper surface of said heating plate and to communicate with a vacuum source.

13. A heating furnace according to claim 11, wherein said pre-heating length and said cooling length are selected based upon a desired pre-heating temperature of the substrate and a desired cooling temperature of the substrate, respectively.

14. A method for heating a substrate in a heating furnace having a vessel which contains a heating plate and a substrate holder, said vessel having an opening port, said heating plate having a plurality of holes extending generally vertically through the heating plate, said substrate holder having a plurality of rods penetrating said holes and projectable upward from the heating plate, said method comprising the steps of:
transferring said substrate into said vessel through said opening port;
mounting said substrate on said substrate holder;
pre-heating said substrate by lowering said substrate holder to position said substrate at a first distance above said heating plate for a first period of time;
heating said substrate by lowering said substrate holder to mount said substrate on said heating plate for a second period of time; and
cooling said substrate by raising said substrate holder to position said substrate at a second distance above said heating plate for a third period of time.

15. A method for heating a substrate according to claim 11, further comprising the step of vacuum attracting said substrate to said heating plate during said heating step.

16. A method for heating a substrate according to claim 14, wherein said first distance and said second distance are selected based upon a desired pre-heating temperature of the substrate and a desired cooling temperature of the substrate, respectively.

17. A method for heating a substrate according to claim 14, wherein said first period of time, said second period of time, and said third period of time are selected based upon a desired pre-heating temperature of the substrate, a desired regular heating temperature of the substrate, and a desired cooling temperature of the substrate, respectively.

18. A method for heating a substrate in a heating furnace having a heating plate and a substrate holder, said heating plate having a plurality of holes extending generally vertically through the heating plate, said substrate holder having a plurality of rods penetrating said holes and projectable upward from the heating plate, said method comprising the steps of:
mounting a substrate on said substrate holder;
positioning said substrate at a pre-heating distance above said heating plate via said substrate holder;
pre-heating said substrate for a first period of time at said pre-heating distance;
lowering said substrate to a heating position in contact with said heating plate via said substrate holder;
heating said substrate for a second period of time at said heating position; and
raising said substrate to a cooling distance above said heating plate via said substrate holder;
cooling said substrate for a third period of time at said cooling distance.

19. A method for heating a substrate according to claim 18, wherein said preheating distance and said cooling distance are selected based upon a desired pre-heating temperature of the substrate and a desired cooling temperature of the substrate, respectively.

20. A method for heating a substrate according to claim 18, wherein said first period of time, said second period of time, and said third period of time are selected based upon a desired pre-heating temperature of the substrate, a desired regular heating temperature of the substrate, and a desired cooling temperature of the substrate, respectively.

* * * * *